United States Patent [19]
Cossutta et al.

[11] 4,066,839
[45] Jan. 3, 1978

[54] MOLDED BODY INCORPORATING HEAT DISSIPATOR

[75] Inventors: Giuseppe Cossutta, Sesto San Giovanni; Marino Cellai, Bresso, both of Italy

[73] Assignee: SGS-ATES Componenti Elettronici S.p.A., Milan, Italy

[21] Appl. No.: 632,589

[22] Filed: Nov. 17, 1975

Related U.S. Application Data

[60] Continuation of Ser. No. 468,296, May 8, 1974, abandoned, which is a division of Ser. No. 415,748, Nov. 14, 1973, abandoned.

[30] Foreign Application Priority Data

Nov. 16, 1972 Italy ................... 31713/72

[51] Int. Cl.² ............................................. H05K 5/00
[52] U.S. Cl. ........................... 174/52 PE; 174/52 FP; 29/588
[58] Field of Search ............. 174/52 FP, 52 PE; 29/588, 627; 357/70, 72; 264/272, 274, 275

[56] References Cited
U.S. PATENT DOCUMENTS

| | | | |
|---|---|---|---|
| 3,444,309 | 5/1969 | Dunn | 29/627 X |
| 3,689,683 | 9/1972 | Paletto et al. | 174/52 PE |
| 3,786,317 | 1/1974 | Thierfelder | 357/72 |

Primary Examiner—J. V. Truhe
Assistant Examiner—D. A. Tone
Attorney, Agent, or Firm—Karl F. Ross

[57] ABSTRACT

A heat-dissipating metal bar to be imbedded in a molded body of plastic material, together with a punched metal foil forming an array of conductor strips to be soldered to a silicon chip, has a large exposed surface and is provided on its opposite surface with projections passing through cutouts in the foil. Upon the molding of the resinous body around the bar, portions of the foil and the silicon chip, one of the mold halves bears upon these projections while the other mold half comes to rest against the exposed bar surface which is thereby pressed into firm contact with that mold half to prevent the intrusion of any resin therebetween. The mold-closing pressure deforms the tips of the projections to help anchor the bar to the resinous body.

8 Claims, 9 Drawing Figures

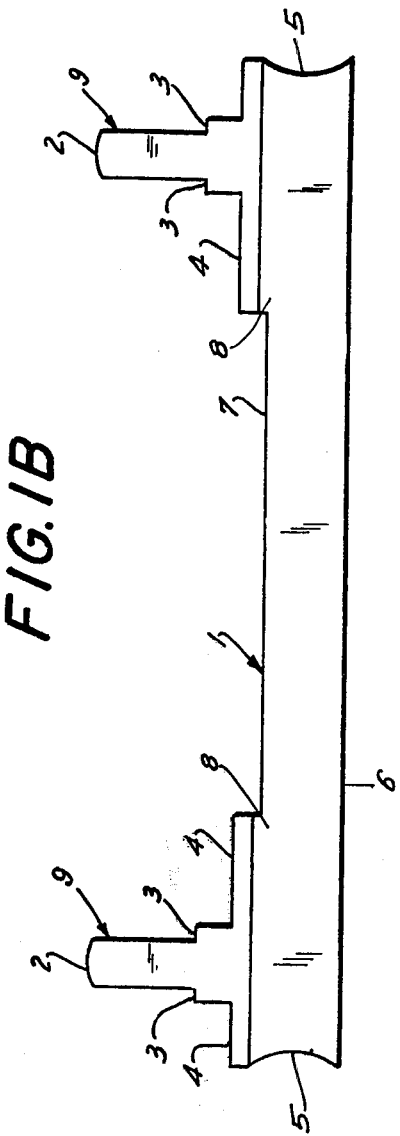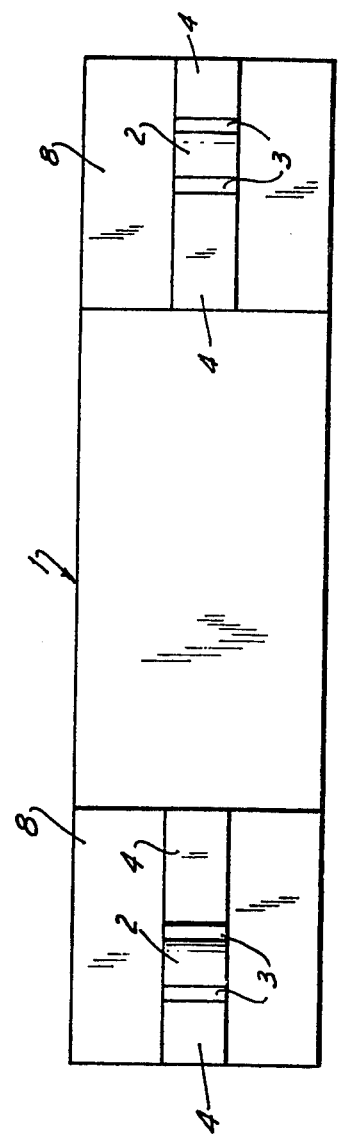

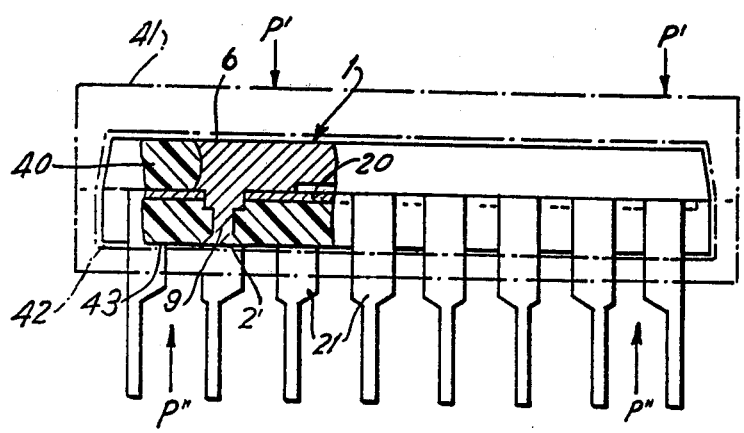
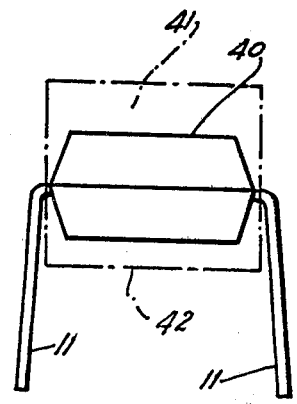
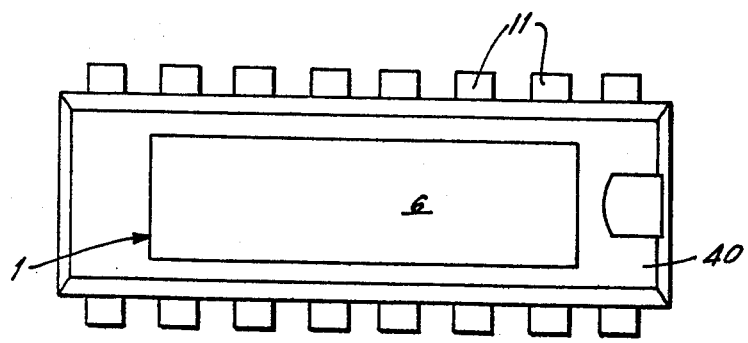

MOLDED BODY INCORPORATING HEAT DISSIPATOR

CROSS-REFERENCE TO RELATED APPLICATIONS

This is a continuation of our application Ser. No. 468,296 filed May 8, 1974, now abandoned, which was a division of application Ser. No. 415,748 filed Nov. 14, 1973, also abandoned.

FIELD OF THE INVENTION

Our present invention relates to a modular unit wherein a heat-dissipating metal block is imbedded in a generally prismatic body of plastic material so as to have a large surface exposed for emitting heat directly or through a radiatior attached thereto. More particularly, the invention has to do with the manufacture of a unit of this type incorporating integrated circuits, as disclosed in commonly owned U.S. Pat. No. 3,689,683.

BACKGROUND OF THE INVENTION

In the above-identified patent, as well as in application Ser. No. 366,864 filed by us jointly with Raimondo Paletto on June 4, 1973, and now abandoned, there has been disclosed a modular unit comprising two sets of conductor strips which are punched from a coherent metal foil and which, in an intermediate state of production, are interconnected by narrow bridges to be subsequently severed so as to insulate the strips from one another. A metal bar or block has a raised central portion constituting a platform which carries a silicon chip with integrated circuitry whose terminals are soldered to the extremities of the several conductor strips converging at that semiconductor. Thereafter the silicon chip and the adjoining parts of the foil are encased in a resinous body which surrounds the periphery of the metal block but leaves its underside exposed and flush with the lower face of that body.

In the molding of such a unit it is sometimes difficult to avoid the intrusion of plastic material between the exposed block surface and the adjoining mold half. It therefore becomes necessary to subject that block surface to a separate cleaning operation after the molding step. An alternative solution resides in temporarily but firmly fastening the block to the adjoining mold half and releasing it from the mold only after the hardening of the resin; this procedure is cumbersome, especially when it is desired to imbed more than one heat-dissipating member of this description in such a body.

OBJECTS OF THE INVENTION

It is, therefore, the object of our present invention to provide an improved modular unit of the general type disclosed in U.S. Pat. No. 3,689,683 wherein one or more metallic members with a large exposed surface, serving as heat dissipators, are embedded in a molded resinous body without the need for any aftertreatment to remove adhering resin or to consolidate the structure.

SUMMARY OF THE INVENTION

These objects are realized, in conformity with our present invention, by providing the heat-dissipating metallic member with one or more projections, on its side opposite the surface to be exposed, and then clamping this member between a pair of mold halves with exertion of pressure by one mold half upon the projection or projections to force the exposed surface into firm contact with the other mold half before letting a mass of plastic material harden between the mold halves around the periphery of the member and the projection or projections thereof.

Advantageously, the clamping pressure exerted by the two closing mold halves is sufficient to deform the tip of each projection for positively anchoring the metallic member or block to the resinous body.

When this process is used to make a modular unit or a series of such units with the aid of a metallic foil to be partly imbedded in the resinous body in contact with the heat-dissipating block, this foil may be provided with a perforation for each projection of that block. In a preferred embodiment, the perforations and the projections penetrating same are symmetrically disposed on opposite sides of a central depression in the face of the block remote from its exposed surface; the semiconductive chip is supported on the block within that depression, either directly or through the intermediary of a central foil portion which may be unitary with two lateral foil portions provided with the afore-mentioned perforations. In that case, the central foil portion can be soldered to the underlying block face for physically uniting the block and the foil. However, the central portion may also be omitted in which case the block may be joined to the foil by a deformation of its projections at the level of the perforated lateral foil portions penetrated thereby.

BRIEF DESCRIPTION OF THE DRAWING

The above and other features of the invention will now be described in detail with reference to the accompanying drawing in which:

FIG. 1A is a face view of a metal block serving as a heat-dissipating member to be imbedded in a resinous body as part of a modulator unit embodying our invention;

FIG. 1B is a side-elevational view of the block shown in FIG. 1A;

FIG. 4A is a side-elevational view (partly in section) of the completed modular unit, with associated mold halves indicated in phantom lines;

FIG. 4B is an end view of the unit of FIG. 4A, again with phantom-line indication of the mold halves, and FIG. 4C is a face view of the finished unit.

SPECIFIC DESCRIPTION

Figure 2A:
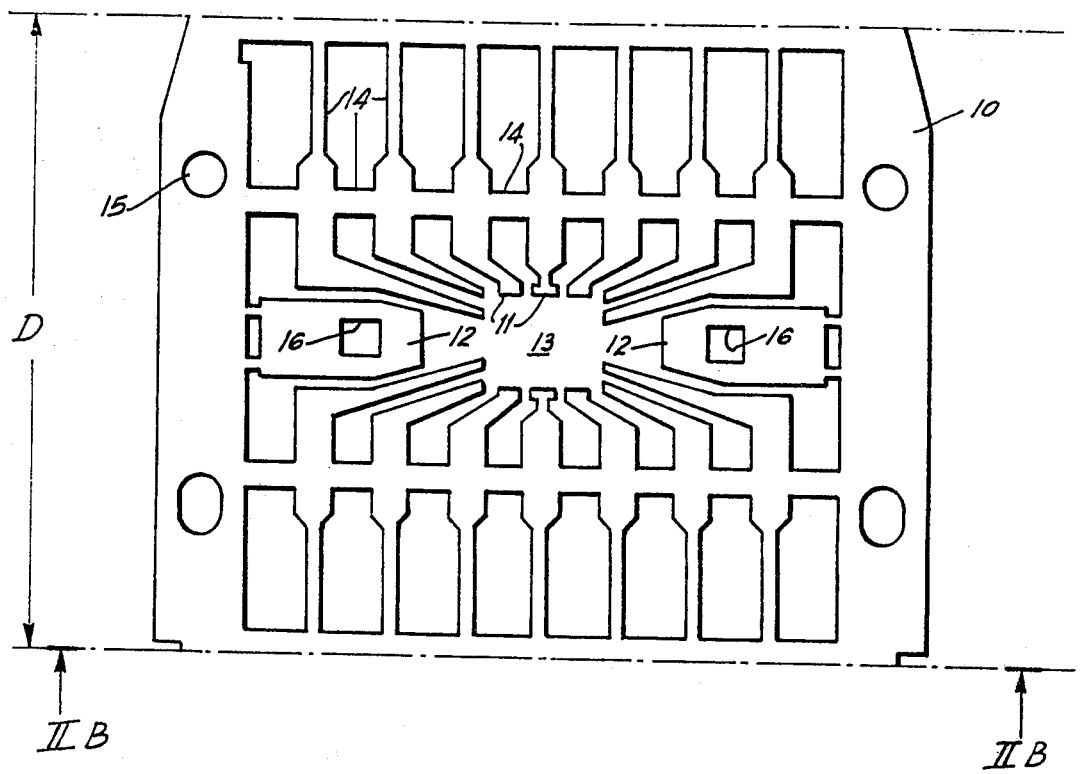
FIG. 2A shows a metal foil to be assembled with the block of FIGS. 1A and 1B as part of a modular unit according to our invention.

In FIGS. 1A and 1B we have shown an elongate block or bar of highly heat-conductive metal, e.g. copper or aluminum, which has a smooth lower major surface 6 and a stepped upper surface forming a central depression 7 bounded by two raised lands 8. Rising from these lands are a pair of projections 9 with tips 2, shoulders 3 and bases 4. The lateral edges of block 1 are incurved at 5 for better adherence to a resinous body in which the bar is to be imbedded with only the surface 6 exposed.

Block 1 with its appendages can be made in a variety of ways, as by forging or casting; it could also be produced in separate parts from sections of extruded profiles soldered or welded to one another. In either case, of course, projections 9 will be rigid with the block.

Figure 2B:
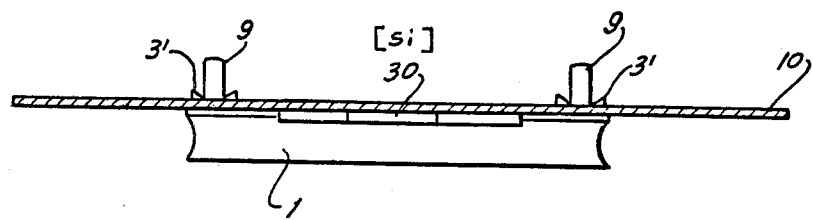
FIG. 2B is a cross-sectional view, taken on the line IIB — IIB of FIG. 2A, of the foil together with an underlying metal block as shown in FIGS. 1A and 1B.

In FIGS. 2A and 2B we have shown a metal foil 10 of highly conductive material, such as silver or copper, from which an array of conductor strips 11 and a pair of lateral tabs 12 are formed, e.g. by punching or etching, in each of several identical sheet sections of length D; only one such section will be described in detail. The tabs 12 terminate short of a rectangular clearance 13 which upon assembly overlies the central depression 7 of block 1 and accommodates a silicon chip 30 illustrated in FIG. 2B. The free inner extremities of strips 11 are soldered to respective terminals of that chip; the outer ends of the stips are temporarily interconnected by bridge portions 14 preserving the continuity of the foil during assembly. These bridge portions lie beyond the outline of block 1 when the foil 10 is superposed upon this block as seen in FIG. 2B. Holes 15 in a marginal sheet portion are designed to receive projections in a workbench holding the sheet in position above block 1 during assembly.

Tabs 12 are formed with respective apertures 16 whose rectangular cross-section corresponds to that of the projections or pegs 9 below the level of shoulders 3. Upon assembly of the foil and the block, the pegs 9 pass through the perforations 16 and are thereafter deformed at 3', e.g. with a chisel, so as to lock the foil firmly to the block or bar 1; in this position the foil 10 rests on the bases 4 with its conductor strips 11 freely overhanging the depressed central part 7 of the block. The silicon chip 30 rests here directly on block 1 which also serves as a ground connection therefor.

Figure 3A:
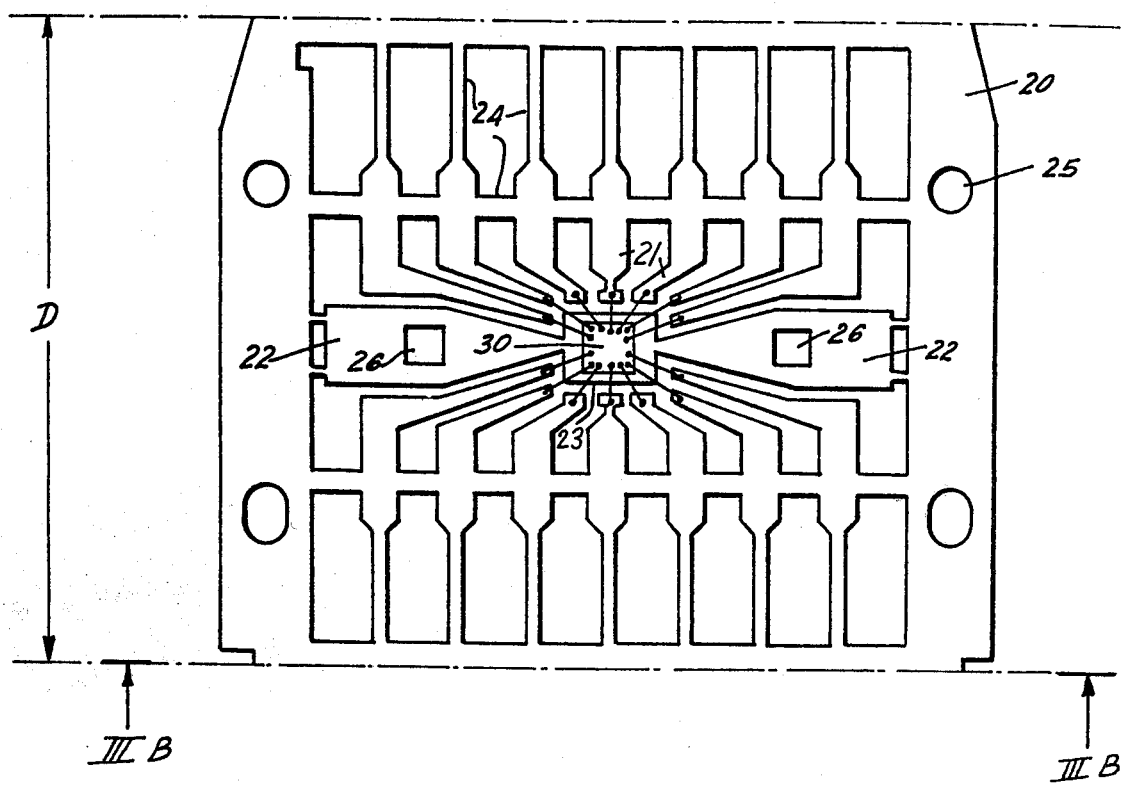
FIG. 3A is a view similar to FIG. 2A, illustrating a modified foil.
Figure 3B:
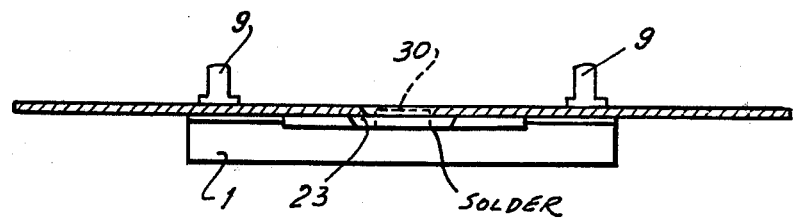
FIG. 3B is a cross-sectional view similar to FIG. 2B but taken on the line IIIB — IIIB of FIG. 3A.

FIGS. 3A and 3B show a similar foil 20 with conductor strips 21, lateral tabs 22, bridge portions 24, mounting holes 25 and perforations 26, the latter being again designed to be traversed by the shoulders 3 of pegs 9 of block 1. In this instance, however, the foil has a central portion 23 which replaces the clearance 13 and supports the chip 30, portion 23 being soldered to the underlying block 1. This connection eliminates the need for deforming the shoulders 3 in the manner illustrated at 3' in FIG. 2B.

Upon emplacement of the parts as shown in FIG. 2B or 3B, the assembly is inserted into a mold with upper and lower halves 41, 42 as seen in FIGS. 4A and 4B; it will be noted that the assembly has been inverted with reference to the preceding Figures, block 1 now lying above its sheet section (specifically foil 20 in FIG. 4A). A resinous body 40 is then molded about the encased portions of the assembly, leaving exposed the bar surface 6. The distance from the tips 2 of pegs 9 to the opposite surface 6 is slightly larger than the inner height of the mold 41, 42 so that pressure is exerted on the bar 1 upon closure of the mold as indicated by arrows P', P''. As a result, surface 6 is pressed firmly against the wall of mold half 41 while the tips of pegs 9 are upset at 2' and thus broadened (as illustrated with a certain amount of exaggeration for the sake of clarity) whereby the molded body 40 and the block or bar 1 are firmly anchored to each other at the lower horizontal face 43 of the body which parallels the flat bar surface 6. Upon severance of the bridges 14 or 24, the outer ends of strips 11 or 21 extend freely from the molded body 40 and can be bent down, as shown, preparatorily to their connection in an external circuit.

Mold halves 41 and 42 may form part of a larger mold serving for the simultaneous shaping of several bodies 40 about respective blocks 1 juxtaposed with different foil sections 10 or 20 of a continuous metal sheet.

We claim:

1. A modular unit comprising a generally prismatic body of plastic material and a heat-dissipating metal block imbedded in said body, said block having a large exposed surface flush with a face of said body and being rigid with at least one solid projection of constant width extending within said body and terminating in a flat broadened tip flush with an opposite face of said body, said projection rising from a side of said block remote from said exposed surface thereof for anchoring said block to said body.

2. A unit as defined in claim 1, further comprising an array of coplanar conductor strips imbedded in said body in direct contact with said block, said strips being part of a metallic foil having a perforation penetrated by said projection.

3. A unit as defined in claim 2 wherein said block is provided on said remote side with a flat base bounding a central depression, said foil contacting said block along said base, said projection rising from said base.

4. A unit as defined in claim 3, further comprising a semiconductor chip bearing integrated circuitry connected to said strips, said chip overlying said block in said depression and being imbedded in said body.

5. A unit as defined in claim 4 wherein said perforation and said projection are symmetrically duplicated on both sides of said depression.

6. A unit as defined in claim 5 wherein the symmetrically disposed perforations are formed in a pair of lateral foil portions unconnected to said integrated circuitry.

7. A unit as defined in claim 6 wherein the symmetrically disposed projections are deformed at the level of said lateral foil portions for physically uniting the latter with said block.

8. A unit as defined in claim 6 wherein a central foil portion supporting said chip is unitary with said lateral foil portions and soldered to said block within said depression.

* * * * *